(12) United States Patent
Kato et al.

(10) Patent No.: US 8,197,716 B2
(45) Date of Patent: Jun. 12, 2012

(54) ELECTROMAGNETIC-WAVE SUPPRESSING MATERIAL, ELECTROMAGNETIC-WAVE SUPPRESSING DEVICE, AND ELECTRONIC APPARATUS

(75) Inventors: Yoshihiro Kato, Kanagawa (JP); Yusuke Suzuki, Kanagawa (JP); Masaki Orihashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 657 days.

(21) Appl. No.: 12/314,732

(22) Filed: Dec. 16, 2008

(65) Prior Publication Data

US 2009/0175021 A1 Jul. 9, 2009

(30) Foreign Application Priority Data

Dec. 19, 2007 (JP) .................................. P2007-327921

(51) Int. Cl.
*H01B 1/16* (2006.01)
*G21F 1/02* (2006.01)

(52) U.S. Cl. ........................ 252/512; 250/515.1; 174/350

(58) Field of Classification Search .................. 252/500, 252/512–514, 518.1, 62.51–62.56; 250/505.1, 250/506.1, 515.1, 517.1, 519.1; 174/350
See application file for complete search history.

(56) References Cited

U.S. PATENT DOCUMENTS

| | | | |
|---|---|---|---|
| 2004/0149472 A1* | 8/2004 | Warner et al. | 174/35 R |
| 2006/0045543 A1 | 3/2006 | Kato et al. | |
| 2010/0108956 A1* | 5/2010 | Miyazawa et al. | 252/574 |

FOREIGN PATENT DOCUMENTS

| | | | |
|---|---|---|---|
| JP | 2006-073991 | | 3/2006 |
| JP | 2006-128570 | * | 5/2006 |
| JP | 2007-027470 | | 2/2007 |
| JP | 2007-27470 | * | 2/2007 |
| WO | 2008/055523 | * | 5/2008 |
| WO | WO2008/118645 A1 | * | 10/2008 |
| WO | WO2010/083075 A1 | * | 7/2010 |

* cited by examiner

*Primary Examiner* — Mark Kopec
(74) *Attorney, Agent, or Firm* — Rader Fishman & Grauer, PLLC

(57) ABSTRACT

An electromagnetic-wave suppressing material is provided. The electromagnetic-wave suppressing material includes an ionic liquid and nanometer-order particles mixed with the ionic liquid, where 10 wt % or more of the nanometer-order particles is mixed with respect to 100 wt % of the ionic liquid.

12 Claims, 12 Drawing Sheets

ELECTROMAGNETIC-WAVE SUPPRESSING MATERIAL, ELECTROMAGNETIC-WAVE SUPPRESSING DEVICE, AND ELECTRONIC APPARATUS

CROSS REFERENCES TO RELATED APPLICATIONS

The present invention contains subject matter related to Japanese Patent Application JP 2007-327921 filed in the Japanese Patent Office on Dec. 19, 2007, the entire contents of which being incorporated herein by reference.

BACKGROUND OF THE INVENTION

1. Field of the Invention

The present invention relates to an electromagnetic-wave suppressing material used to suppress undesired electromagnetic radiation from an electronic apparatus, an electromagnetic-wave suppressing device including such an electromagnetic-wave suppressing material, and an electronic apparatus having the electromagnetic-wave suppressing device including the electromagnetic-wave suppressing material.

2. Description of the Related Art

An increase in use of high-frequency electromagnetic waves in recent years has newly caused environmental disadvantages such as malfunction of an apparatus due to electromagnetic wave noise and undesirable influences of such electromagnetic radiation on the human's brain and body. For example, a 2.45 GHz band, one of frequency bands available in license-exempt wireless communications, has been used in many apparatuses for wireless LAN (IEEE 802.11b), Blue Tooth®, ISM (Industrial, Scientific and Medical), and so on. Furthermore, speedup and digitalization of clock frequencies of information apparatuses may cause harmonics in such a frequency band. Thus, risks of the occurrence of interference are highly increasing because of exponential increases in numbers and diversities of both potential electromagnetic wave source and interference-damage receiving side.

In order to cope with such electromagnetic interferences (EMI), individual apparatuses may need to be sufficiently resistant to any influence of electromagnetic waves coming from the outside (i.e., an improvement in immunity). Simultaneously, the apparatuses may need to be prevented from radiating undesired electromagnetic waves which may interfere with normal operations of other apparatuses (i.e., suppression of emission). Such requirements are collectively referred to as electromagnetic compatibility (EMC). Various standards have been defined for allowing electronic apparatuses to ensure electromagnetic compatibility under electromagnetic environment.

For obtaining EMC in circuit design, a disturbance-suppressing element has been mainly used as a circuit element for preventing an electromagnetic disturbance wave from entering an electronic apparatus in addition to reducing the electromagnetic disturbance wave generated from the electronic apparatus.

Examples of the disturbance-suppressing element include a varistor and an LC filter which is a combination of capacitors and induction coils. These elements are designed so that they have a small loss when desired signals pass through the elements and have a large reflection loss and passage loss against disturbance waves. These elements can be combined by any suitable method and used in almost all electronic circuits.

However, the combination of a disturbance-suppressing element and a circuit element may cause a specific resonance frequency. In this case, voltage and current waveforms may oscillate to distort a desired signal waveform. Besides, the wavelength of an electromagnetic wave in the range of GHz band frequencies may be close to the circuit length of an electromagnetic circuit. Thus, the circuit itself may act as an antenna for the electromagnetic wave, possibly causing the circuit to malfunction.

Thus, when the EMC may not be obtained at the stage of circuit design, it has been attempted to obtain EMC in the stage of packaging design.

In recent years, an attention has been drawn to the use of a material for suppressing or absorbing an electromagnetic wave (hereinafter, collectively referred to as an "electromagnetic-wave suppressing material") in the form of a sheet prepared by mixing magnetic powder with resin.

The principle of the electromagnetic-wave absorption in the electromagnetic-wave suppressing or absorbing material is a conversion of most electromagnetic-wave energy incident thereon into thermal energy in the inside of the material. Therefore, each of the electromagnetic-wave suppressing and absorbing materials can lower the amounts of both the energy reflected in the forward direction and the energy permeated in the backward direction.

Here, mechanisms of converting electromagnetic-wave energy to thermal energy can be mainly classified into three types: conduction loss, dielectric loss, and magnetic loss. Electromagnetic-wave absorption energy per unit volume, P [W/m$^3$], is expressed by the following Equation 1 using electric field E, magnetic field H, and electromagnetic-wave frequency f.

$$P = \frac{1}{2}\sigma|E|^2 + \pi f \varepsilon''|E|^2 + \pi f \mu''|H|^2 \qquad \text{[Equation 1]}$$

Electric conductivity: $\sigma$
Complex permittivity: $\varepsilon = \varepsilon' - j\varepsilon''$
Complex magnetic permeability: $\mu = \mu' - j\mu''$ In the Equation 1, the first term represents conduction loss, the second term represents dielectric loss, and the third term represents magnetic loss.

Magnetic materials have been typically used as materials for suppressing electromagnetic waves in the high-frequency band.

Thus, magnetic sheets made of magnetic materials are designed to increase the magnetic permeability, the third term $\mu''$ of the above Equation 1, for suppressing and absorbing electromagnetic waves.

On the other hand, the present inventors have proposed a material having a high permittivity $\varepsilon''$, the second term of the above Equation 1, indicating the dielectric loss at a frequency in the MHz or GHz band (see Japanese Unexamined Patent Application Publication No. 2006-73991).

The present inventors have paid their attention to the permittivity of a liquid material with ions such as an electrolyte and have proposed an electromagnetic-wave suppressing material with a high electromagnetic-wave absorbing efficiency as described above. The electrolyte, which contains ions, causes ionic conduction in response to the applied electric field. Unless it is a superconductive material, there is a resistance component in the electrolyte. Accordingly, the ionic conductance is influenced by the amount of such resistance component, though depending on the kind of a solvent or the like. Thus, such a resistance component may correspond to the loss part $\varepsilon r''$ of the specific permittivity. In addition, the loss part $\varepsilon r''$ of the specific permittivity may have a value in the range of several tens to several hundreds or more at a frequency of 1 GHz or less. In other words, the electrolyte with ions may convert the incident electromagnetic-wave energy into Joule heat and also may absorb the energy.

However, any water-containing material, such as an electrolyte, may require a difficult technology in terms of volatilization of water while securing the reliability thereof in "property retention for several years or for ten or more years".

Therefore, the feature of preventing water from volatilization may need to be added not to the electromagnetic-wave suppressing material but a material laminated thereon.

In consideration of the above reliability, the present inventors have proposed an electromagnetic-wave suppressing material using an ionic liquid (ion liquid) containing only ions (see Japanese Unexamined Patent Application Publication No. 2007-27470).

The use of the ionic liquid (ion liquid) containing only ions leads to an increase in the amount of electromagnetic-wave suppression/absorption. Further, volatilization of a liquid material can be prevented by taking advantage of its boiling point of several hundred degrees Celsius.

Furthermore, the ionic liquid containing only ions has the properties of nonvolatility, nonflammability, thermal stability, chemical stability, high ionic conductivity, and electric polarization tolerance.

SUMMARY OF THE INVENTION

However, in the case of using an ionic liquid (ion liquid) such as one described above alone, the effects of suppressing and absorbing electromagnetic waves can be determined by the physical properties of the ionic liquid (ion liquid). Thus, it is difficult to obtain further improvements in electromagnetic-wave suppression/absorption effects.

Furthermore, the ionic liquid has a low viscosity. For making an electromagnetic-wave suppressing material in sheet form or any desired form, a material having a certain degree of viscosity can be made in sheet form without difficulties. However, a sufficient viscosity may not be obtained with the ionic liquid alone.

It is desirable to provide an electromagnetic-wave suppressing material having an increased electromagnetic-wave suppressing effect and, from design and manufacture perspective, flexibly of making into any of various forms while securing high reliability. It is also desirable to provide an electromagnetic-wave suppressing device using the electromagnetic-wave suppressing material. Furthermore, it is desirable to provide an electronic apparatus including the electromagnetic-wave suppressing material and the electromagnetic-wave suppressing device.

According to an embodiment of the present invention, there is provided an electromagnetic-wave suppressing material including an ionic liquid and nanometer-order particles mixed with the ionic liquid, wherein 10 wt % or more of the nanometer-order particles is mixed with respect to 100 wt % of the ionic liquid.

According to another embodiment of the present invention, there is provided an electromagnetic-wave suppressing device including the electromagnetic-wave suppressing material according to the above embodiment of the invention.

According to further embodiment of the present invention, there is provided an electronic apparatus including an integrated circuit device, a wiring line, and the electromagnetic-wave suppressing device according to the above embodiment, where the electromagnetic-wave suppressing device is located in the vicinity of the integrated circuit device or the wiring line.

According to the configuration of the electromagnetic-wave suppressing material of the above embodiment of the invention, a sufficient viscosity can be obtained by mixing 10 wt % or more of nanometer-order particles with respect to 100 wt % of an ionic liquid (ion liquid). Thus, the electromagnetic-wave suppressing material in slurry or paste form can be obtained.

Therefore, the electromagnetic-wave suppressing material can be made in sheet form or any desired form.

In addition, the ionic liquid is excellent in nonvolatility, nonflammability, thermal stability, and chemical stability, so that an electromagnetic-wave suppressing material can be provided with the properties of the ionic liquid (ion liquid).

Furthermore, the electromagnetic-wave suppressing material can be provided with the properties of nanometer-order particles, such as permittivity and magnetic permeability thereof, and the physical properties of the electromagnetic-wave suppressing material can be controlled.

According to the configuration of the electromagnetic-wave suppressing device of the above embodiment of the invention, it is made of the electromagnetic-wave suppressing material of the above embodiment of the invention. Since the electromagnetic-wave suppressing material can be made in sheet form or any desired form, the electromagnetic-wave suppressing device can be made in any form.

In addition, according to the configuration of the electronic apparatus of the above embodiment of the invention, the apparatus includes the electromagnetic-wave suppressing device located in the vicinity of an integrated circuit device or a wiring line, so that radiation of the electromagnetic waves generated from an integrated circuit device or a wiring line to the outside of the apparatus can be suppressed. Furthermore, the electromagnetic-wave suppressing device of the above embodiment of the invention can be made in any desired form. Thus, the electromagnetic-wave suppressing device can be easily mounted on any place in the vicinity of an integrated circuit device or a wiring line in the electronic apparatus.

According to the electromagnetic-wave suppressing material and the electromagnetic-wave suppressing device of the above embodiments, the electromagnetic-wave suppressing material can be made in sheet form or any desired form and thus the electromagnetic-wave suppressing device in any desired form can be designed.

In addition, since the ionic liquid included in the electromagnetic-wave suppressing material is excellent in nonvolatility, nonflammability, thermal stability, and chemical stability, both the electromagnetic-wave suppressing material and the electromagnetic-wave suppressing device can be provided with high environmental reliability against temperature changes or the like.

Furthermore, both the electromagnetic-wave suppressing material and the electromagnetic-wave suppressing device can be provided with the properties of nanometer-order particles, such as permittivity and magnetic permeability thereof, and the physical properties of the electromagnetic-wave suppressing material can be controlled, so that further improvements in effects of suppressing and absorbing electromagnetic waves can be obtained.

Furthermore, according to the electronic apparatus of the above embodiment of the invention, radiation of the electromagnetic waves generated from an integrated circuit device or a wiring line to the outside of the apparatus can be suppressed. Thus, the electronic apparatus with electromagnetic compatibility and high reliability for stable operation can be obtained.

BRIEF DESCRIPTION OF THE DRAWINGS

FIG. 1A, FIG. 1B, and FIG. 1C represent different chemical formulae, respectively.

FIG. 2A, FIG. 2B, and FIG. 2C represent different configurations of the electromagnetic-wave suppressing device, respectively.

FIG. 3A is a perspective view of the device and FIG. 3B is a cross-sectional view thereof.

FIG. 12A and FIG. 12B are cross-sectional views of different configurations of the main parts of the video camera shown in FIG. 10.

FIG. 15A is a schematic view, FIG. 15B is a cross-sectional view, and FIG. 15C is a schematic perspective view.

DESCRIPTION OF THE PREFERRED EMBODIMENTS

First, the outline of an embodiment of the present invention will be described.

According to an embodiment of the present invention, an electromagnetic-wave suppressing material includes a mixture of an ionic liquid (ion liquid) and nanometer-order particles.

The ionic liquid (ion liquid) preferably contains positive ions and negative ions. For the positive ions (cations), any of aromatic compounds such as imidazolium salts and pyridinium salts, aliphatic quaternary ammonium salts, and aliphatic cyclic ammonium salts can be used. For the negative ions (anions), any of inorganic ions, such as tetrafluoroborate ($BF_4^-$) and 6-fluorophosphate ($PF_6^-$), and fluorine-containing organic anions, such as $CF_3SO_2^-$ and perfluoro sulfone imide ($(CF_3SO_2)_2N^-$: TFSI) can be used.

Combinations of these ions are typically used as materials for the ionic liquid. However, the present embodiment is not limited to these materials.

Figure 1A:
FIGS. 1A to 1C are schematic diagrams illustrating chemical formulae of components used for an ionic liquid in an electromagnetic-wave suppressing material according to an embodiment of the present invention, where
Figure 1B:
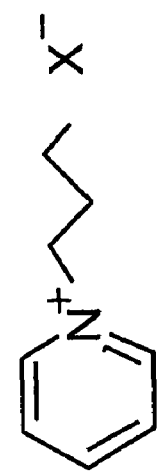
Figure 1C:
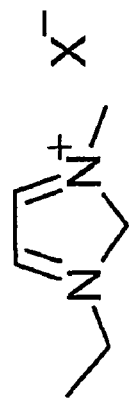

FIGS. 1A to 1C represent chemical formulae of materials of ionic liquids prepared with different combinations of the above materials. Such materials are used for the ionic liquid in the embodiment of the invention.

FIG. 1A represents the chemical formula of the material prepared by combining 1-ethyl-3-methyl imidazolium (EMI), one of imidazolium salts, with an anionic ion $X^-$ (($CF_3SO_2)_2N^-$, $BF_4^-$, $PF_6^-$, or the like).

FIG. 1B represents the chemical formula of the material prepared by combining 3-butyl pyridium (BP), one of pyridinium salts, with the anionic ion $X^-$.

FIG. 1C represents the chemical formula of the material prepared by combining trimethyl hexyl ammonium, one of aliphatic quaternary ammonium salts, with the anionic ion $X^-$.

Ionic liquids including such materials have the properties of nonvolatility, nonflammability, thermal stability, chemical stability (being hardly changed over time because ions may not react with other components), high ion conductivity, and electric polarization tolerance.

In such ionic liquids, amounts of electromagnetic-wave suppression and absorption are increased by ionic conduction caused in the ionic liquid due to the action of electromagnetic wave and Joule heat generated by the collision of ions in the ionic conduction. In particular, such ionic liquids are excellent in nonvolatility and stability because the coagulating point thereof is $-20°$ C. and the boiling point or the decomposition point thereof is as high as several hundred degrees Celsius.

In the embodiment of the present invention, the nanometer-order particles mixed with an ionic liquid may preferably be a dielectric material with a specific permittivity of 10 or more at 1 kHz at room temperature or a magnetic material with a relative magnetic permeability of 100 or more at 100 MHz at room temperature. The use of such a dielectric or magnetic material as nanometer-order particles can provide the electromagnetic-wave suppressing material with additional properties of permittivity, magnetic permeability, and the like.

Examples of the dielectric material with a specific permittivity of 10 or more at 1 kHz at room temperature include barium titanate, lead zirconium titanate, and titanium oxide. In addition, examples of the magnetic material with a relative magnetic permeability of 100 or more at 100 MHz at room temperature include Mn—Zn ferrite, Ni—Zn ferrite, and Cu—Zn ferrite.

Materials of the nanometer-order particles used in the embodiment of the invention are not limited to these materials.

The nanometer-order particles used may be those with a particle size of less than 1 μm, more preferably of about 300 nm or less. The electromagnetic-wave suppressing material can be prepared by mixing 10 wt % of such particles with respect to 100 wt % of the ionic liquid.

In this way, the electromagnetic-wave suppressing material can be provided with sufficient viscosity as it is prepared by mixing 10 wt % or more of nanometer-order particles with respect to 100 wt % of an ionic liquid. Furthermore, the electromagnetic-wave suppressing device can be made in slurry or paste form as it is made of such an electromagnetic-wave suppressing material. In other words, it becomes possible to provide electromagnetic-wave suppressing devices in various forms, such as sheet and bulk forms and also in other desired forms.

Figure 2A:
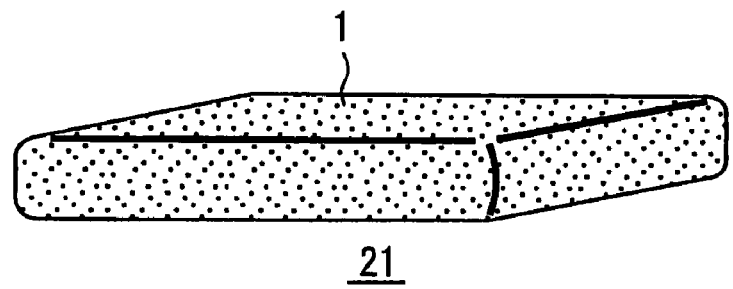
FIGS. 2A to 2C are schematic views illustrating an electromagnetic-wave suppressing device made of an electromagnetic-wave suppressing material according to an embodiment of the present invention, where
Figure 2B:
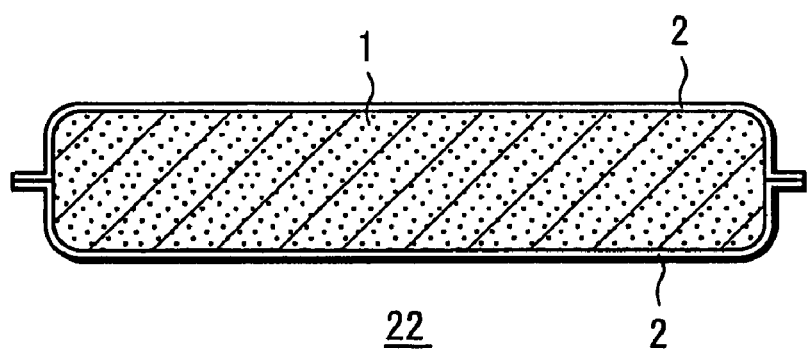
Figure 2C:
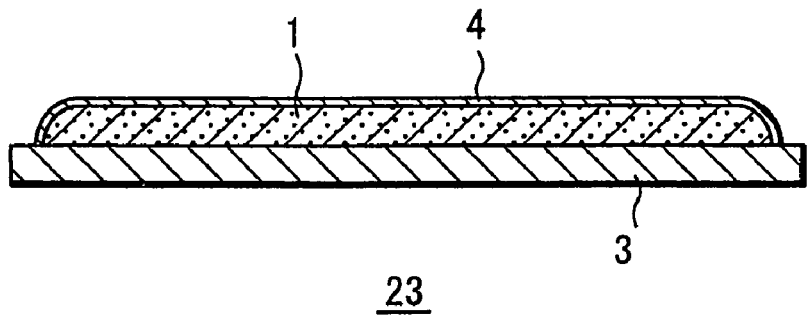

Next, FIGS. 2A to 2C show different configurations of electromagnetic-wave suppressing devices, each of which is made of an electromagnetic-wave suppressing material. Each of the electromagnetic-wave suppressing devices includes an electromagnetic-wave suppressing material 1 prepared by mixing any of the above-described ionic liquids with nanometer-order particles.

FIG. 2A shows an electromagnetic-wave suppressing device 21 configured using the electromagnetic-wave suppressing material 1 alone in sheet form or the like. Here, the electromagnetic wave material may be made in bulk form instead of sheet form.

FIG. 2B shows an electromagnetic-wave suppressing device 22 configured by covering the electromagnetic-wave suppressing material 1 with a film (sealing member) to be sealed. The film 2 may be a film container with or without electronic-wave absorbability. Preferably, however, it is not a film reflecting electromagnetic waves (e.g., aluminum foil).

FIG. 2C shows an electromagnetic-wave suppressing device 23 configured by covering the electromagnetic-wave suppressing material 1 placed on a board 3 with a laminate material 4 made of an insulating material so that the electromagnetic-wave suppressing device 23 can be sealed between the board 3 and the laminate material 4.

Measurement of Properties

Here, the electromagnetic-wave suppressing material according to the embodiment of the present invention was actually produced and the properties thereof were then investigated. An ionic liquid was prepared using 1-ethyl-3-methyl imidazolium (EMI) as a positive ion and bis-trifluoromethyl sulfonylimide (TFSI) as a negative ion, followed by mixing the ionic liquid with titanium oxide ($TiO_2$) powder with a particle size of about 20 nm to 30 nm as nanometer-order particles.

The mixing of these components was carried out using a mixer. The amount of mixed titanium oxide powder was changed to 5 wt %, 10 wt %, and 15 wt % with respect to 100 wt % of the ionic liquid and samples were then prepared for the respective mixing amounts.

The samples of the respective mixing amounts were subjected to the measurement of the viscosity of materials in mixture. The results of the viscosity measurement are listed in Table 1.

TABLE 1

| Sample | Viscosity |
|---|---|
| Ionic liquid + $TiO_2$ (5 wt %) | 154 cP |
| Ionic liquid + $TiO_2$ (10 wt %) | 1260 cP |
| Ionic liquid + $TiO_2$ (15 wt %) | >9500 cP |

As shown in Table 1, the higher the amount of titanium oxide to be mixed increases, the more the viscosity increases. In other words, a sufficiently high viscosity of 1000 cP or more was obtained with 10 wt % or more of titanium oxide. Therefore, a desired amount of titanium oxide to be mixed is 10 wt % or more.

Here, 1 cP (centipoise)=0.01 P=0.001 Pa·s=1 mPa·s.

On the other hand, as a comparative example, a sample was prepared by mixing ferrite powder with a particle size of about 20 μm to 30 μm with the ionic liquid (ion liquid). In the sample of the comparative example, the ionic liquid (ion liquid) and the ferrite powder were separated from each other, so that a mixing state (i.e., slurry or paste state) was not obtained.

As a result, it is found that an increase in viscosity can be obtained by mixing the nanometer-order particles with the ionic liquid (ion liquid) in comparison with the ionic liquid alone.

Next, the electromagnetic-wave suppressing effects of the respective samples were measured.

Here, a method for the measurement will be described with reference to FIGS. 3 and 4.

Figure 3A:
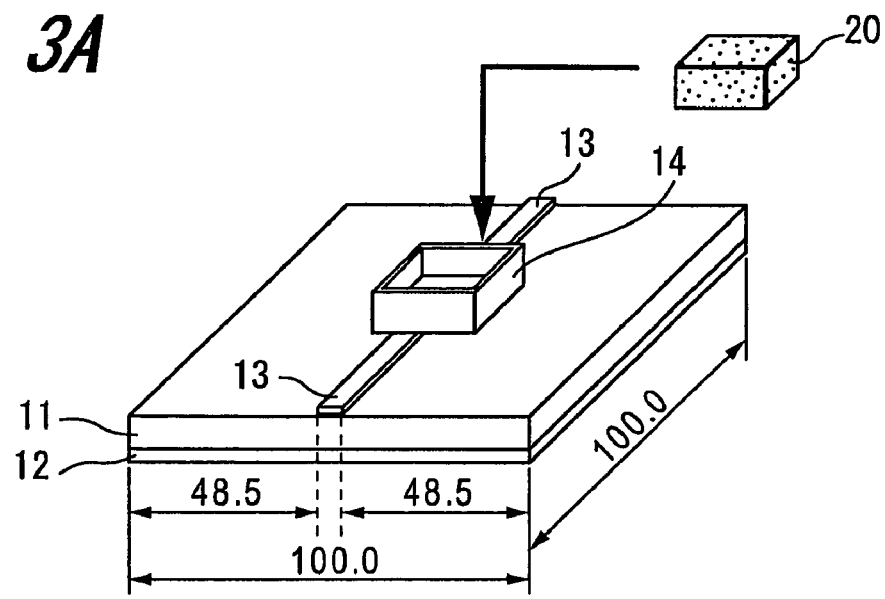
FIGS. 3A and 3B are schematic views illustrating a method of measuring an electromagnetic-wave suppressing effect of an electromagnetic-wave suppressing device according to an embodiment of the present invention, where
Figure 3B:
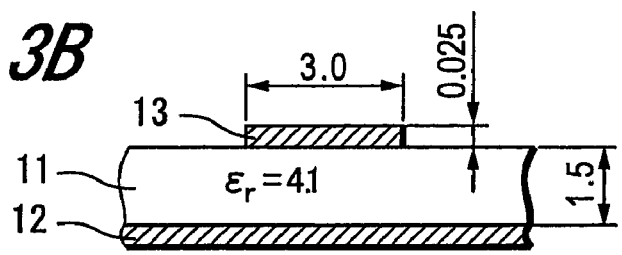

FIGS. 3A and 3B illustrate an electromagnetic-wave suppressing device, where FIG. 3A is a schematic view thereof and FIG. 3B is a cross-sectional view thereof. The electromagnetic-wave suppressing device was prepared by forming a micro-strip line 13 on a board 11 having a ground-potential conductive layer 12 on the backside thereof. A sample 20 was mounted on the micro-strip line 13.

Furthermore, the board 11 with a permittivity $\in_r$ of 4.1 had a height of 100.0 mm, a width of 100.0 mm, and a thickness of 1.5 mm.

On the other hand, the micro-strip line 13 had a film thickness of about 0.025 mm, a width of 3.0 mm, and a length of 100.0 mm. In addition, the micro-strip line 13 is designed to have a characteristic impedance of about 50 Ω.

For comparatively evaluating the electromagnetic-wave suppressing effects of the respective samples in the same volume, a vessel (the inner dimensions thereof: 22 mm×22 mm×5 mm, the wall thickness thereof: 0.2 mm) 14 for mounting a sample thereon was arranged on the micro-strip line 13. Then, the sample 20 was placed in the vessel 14.

Figure 4:
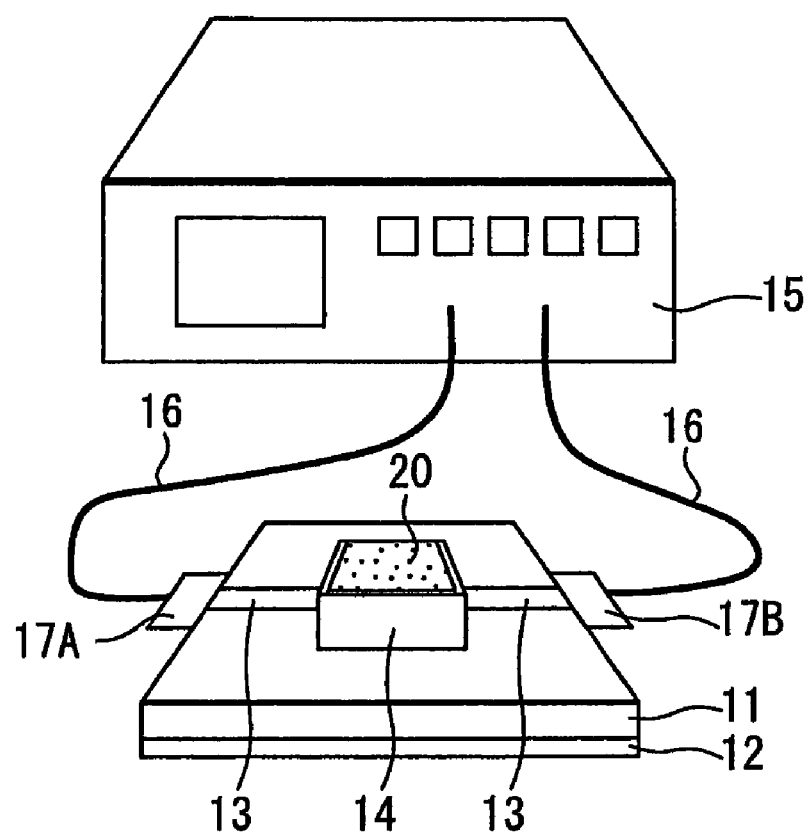
FIG. 4 is a schematic perspective view illustrating an apparatus and method of measuring an electromagnetic-wave suppressing effect of an electromagnetic-wave suppressing device according to an embodiment of the present invention.

Furthermore, as shown in FIG. 4, a network analyzer 15 was used as a measuring apparatus. The network analyzer 15 was connected to the both ends of the micro-strip line 13 through wiring lines 16. Then, an input terminal 17A and an output terminal 17B were provided to the terminal areas between the wiring lines 16 and the micro-strip line 13.

Then, a signal was input from the input side of the micro-strip line 13 and output to the output side thereof to determine the reflection and transmission properties of the sample 20.

In addition, as a comparative example, the same measurement was carried out without the sample 20.

When the signal is input into the input side of the micro-strip line 13, the loss amount is obtained by subtracting both the reflected amount (S11) and the transmitted amount (S21) from the input amount. The ratio of the loss amount to the input amount is obtained as a loss ratio (Loss). The reflected amount (S11) is obtained from the measured reflection property, while the transmitted amount (S12) is obtained from the measured transmission property. The frequency characteristic of loss ratio was calculated from the input amount, and the reflection amount and the transmitted amount.

Figure 5:
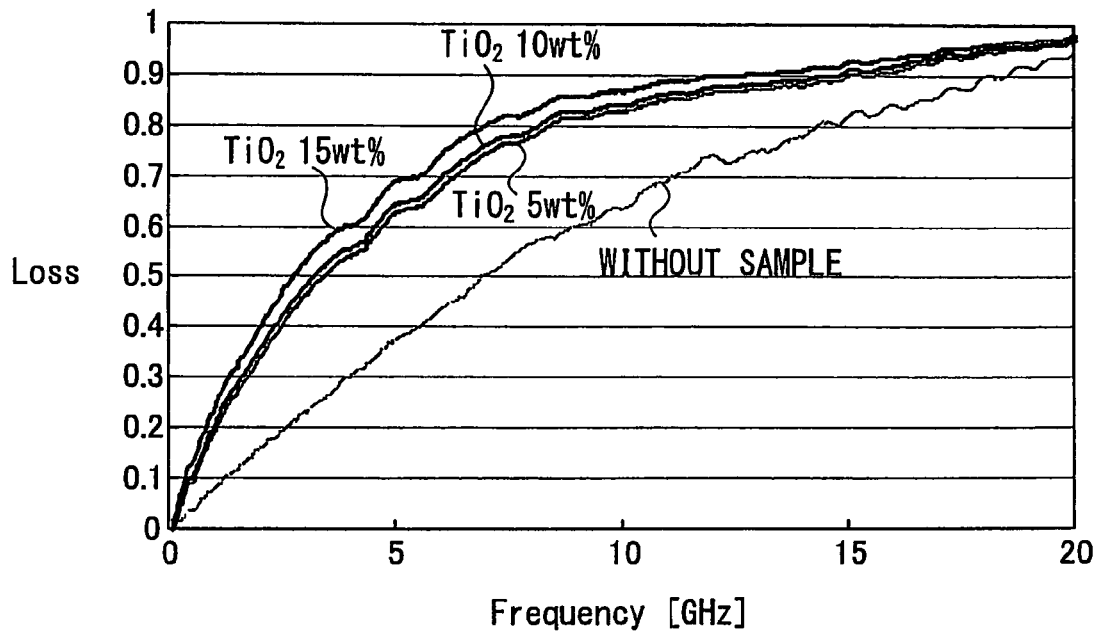
FIG. 5 is a graphic diagram illustrating properties of loss absorbed by a sample or a micro-strip board shown in FIG. 4.

FIG. 5 represents the properties of loss absorbed by the sample 20 or the micro-strip board 11 as the results of measuring the electromagnetic-wave suppressing effects. As shown in FIG. 5, the vertical axis represents the ratio of loss (Loss) and the horizontal axis represents the frequency.

Figure 6:
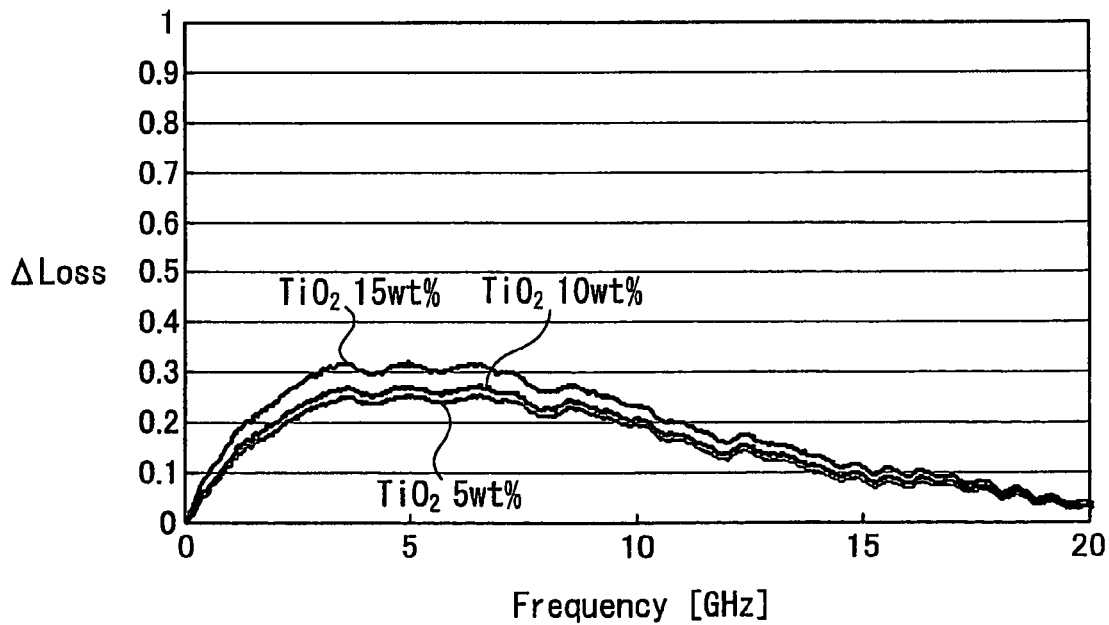
FIG. 6 is a graphic diagram illustrating the amount of loss from the sample shown in FIG. 4.

Furthermore, FIG. 6 shows the amount of loss in each sample 20, which is obtained by subtracting the amount of loss without the sample 20 from the measurement result shown in FIG. 5, or the amount of loss in the sample 20 from which the loss in the micro-strip board 11 was removed (ΔLoss: an electromagnetic-wave suppressing effect).

FIGS. 5 and 6 indicate that an increase in the amount of nanometer-order titanium oxide powder mixed with the ionic liquid (ion liquid) leads to an increase in an electromagnetic-wave suppressing effect.

Such results may be obtained, because the permittivity (or conductivity) of the sample 20 is changed by mixing titanium oxide.

Furthermore, the specific permittivity of the respective samples were measured.

Figure 7:
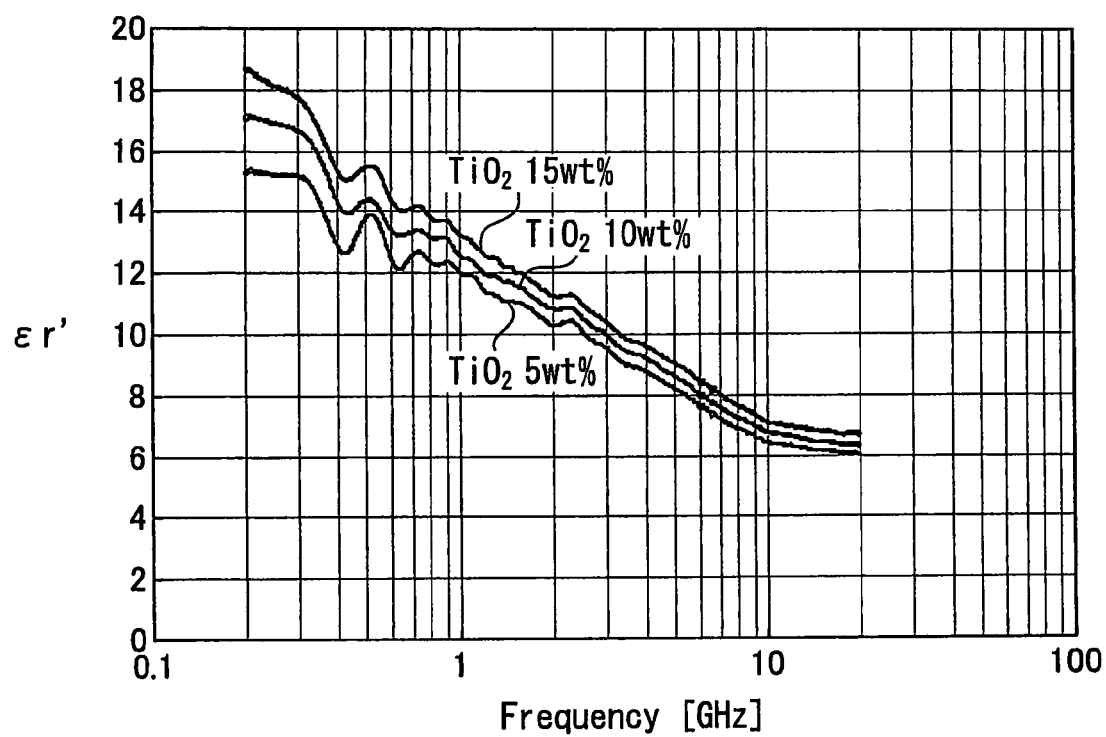
FIG. 7 is a graphic diagram illustrating results of measured specific permittivity of respective samples.

The results of the measurement are shown in FIG. 7.

FIG. 7 indicates that an increase in the amount of titanium oxide mixed leads to an increase in the specific permittivity of the respective samples. A change in physical property may be related to a change in the amount of electronic wave suppression.

Thus, an electromagnetic-wave suppressing material in a slurry or paste form can be provided by mixing nanometer-order dielectric material powder with an ionic liquid (ion liquid). In addition, a permittivity can also be controlled.

Furthermore, the same effects as that of the dielectric material can be obtained even if nanometer-order magnetic material powder is mixed with an ionic liquid (ion liquid). In addition, the ionic liquid (ion liquid) can be further provided with the magnetic permeability.

Therefore, it becomes possible to provide a suitable material for suppressing electromagnetic waves and design an electromagnetic-wave suppressing device using such a material by mixing the nanometer-order particles of the dielectric material or the magnetic material with the ionic liquid (ion liquid).

Next, examples of an electronic apparatus according to an embodiment of the present invention will be described. Here, the electromagnetic-wave suppressing material and the electromagnetic-wave suppressing device according to an embodiment of the present invention are included in these electronic apparatuses.

Figure 8:
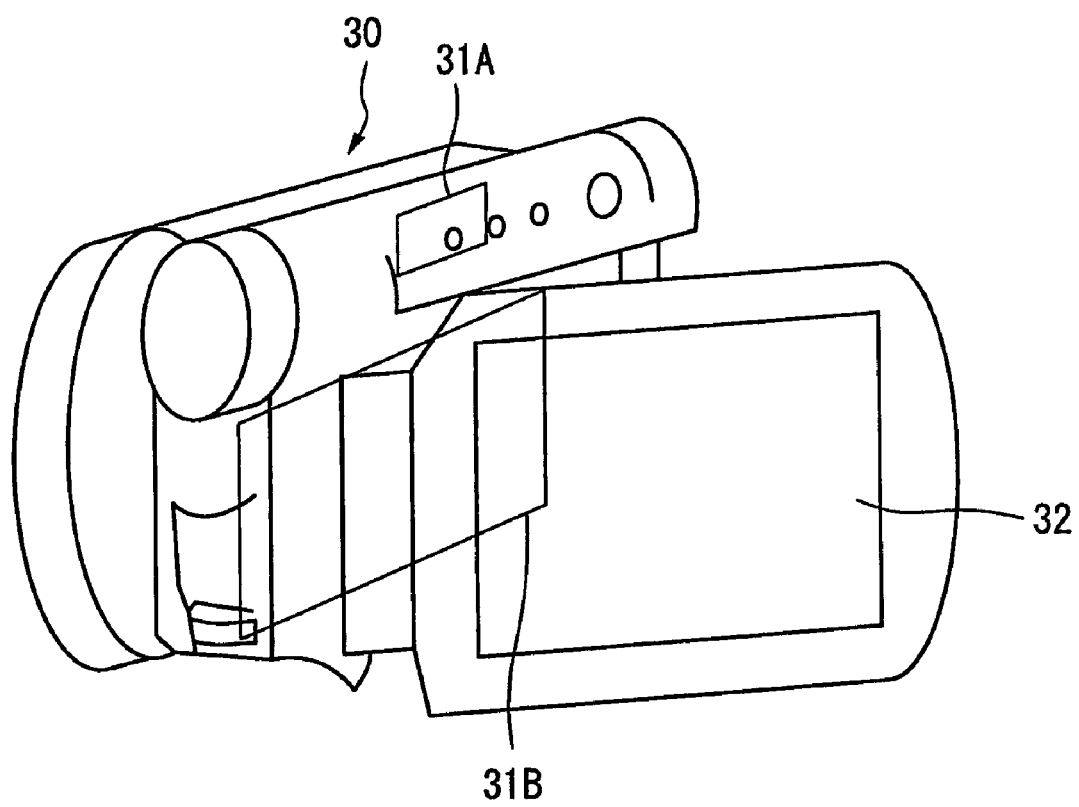
FIG. 8 is a schematic perspective view illustrating a first example of a video camera as an electronic apparatus according to an embodiment of the present invention.

FIG. 8 is a schematic perspective view illustrating a video camera that is a first example of the electronic apparatus according to an embodiment of the present invention.

As shown in FIG. 8, a video camera 30 includes an A-board (printed-wiring board) 31A on which electronic parts are mounted, a B-board (printed-wiring board) 31B on which electronic parts are mounted, and a monitor screen 32.

Figure 9:
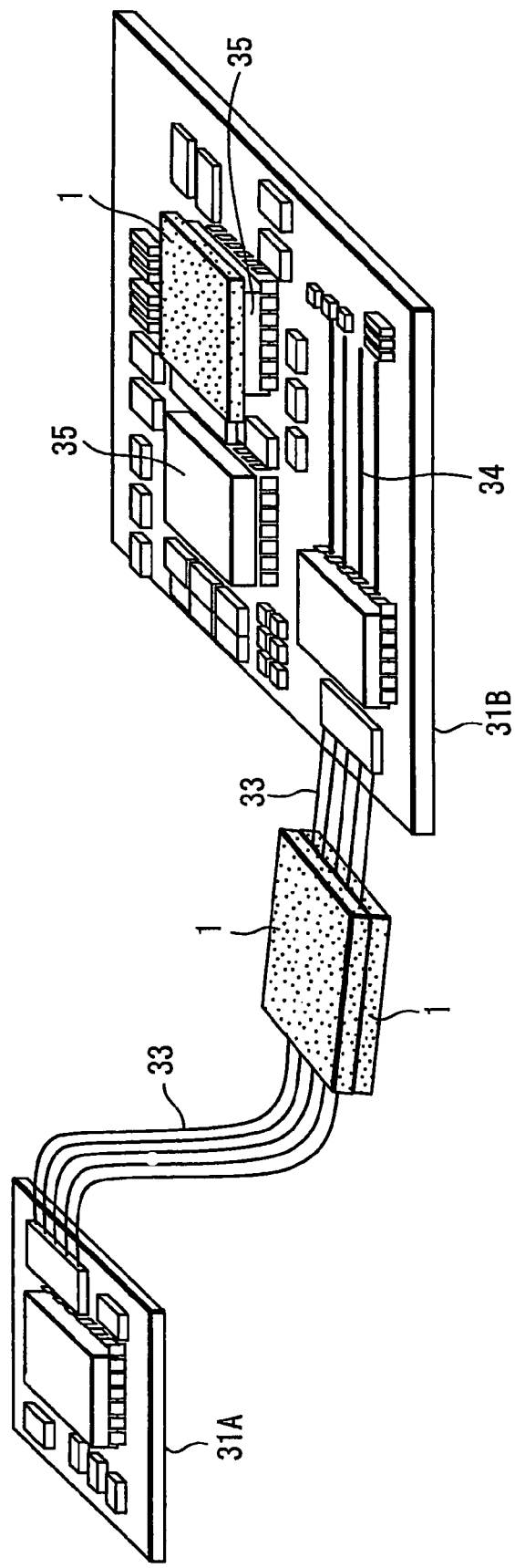
FIG. 9 is a schematic perspective view illustrating main parts of the video camera shown in FIG. 8.

FIG. 9 is a perspective view illustrating main parts of the video camera 30. As shown in FIG. 9, in this video camera 30, the electromagnetic-wave suppressing materials 1 according to an embodiment of the invention may be arranged to hold a flexible-wiring lines 33 electrically connecting the A-board 31A and the B-board 31B. Another electromagnetic-wave suppressing material 1 may be arranged on other places. For example, it may be attached to the upper surface of an integrated circuit (IC) chip 35 or the like mounted on the respective boards 31A and 31B.

Further, the electromagnetic-wave suppressing material 1 may be attached not only to the top surface of the IC chip 35 or the like, but also to the side of the IC chip 35 or in the vicinity thereof. In that case also, an electromagnetic-wave suppressing effect can be obtained.

Furthermore, the electromagnetic-wave suppressing material according to an embodiment of the present invention can be arranged in the vicinity of wiring lines 34 on the B-board 31B as illustrated in FIG. 9.

In this example, the electromagnetic-wave suppressing material 1 is made in sheet form or the like to form the electromagnetic-wave suppressing device with the electromagnetic-wave suppressing material 1 alone in a manner similar to the electromagnetic-wave suppressing device 21 as illustrated in FIG. 2A.

In the first example as described above, the radiation of electromagnet waves generated from the IC chip 35 and the wiring lines 33 and 34 can be suppressed with the electromagnetic-wave suppressing materials 1 arranged in the vicinity of the IC chip 35 and the wiring lines 33 and 34.

Instead of forming the electromagnetic-wave suppressing device using the electromagnetic-wave suppressing material 1 alone as illustrated in FIG. 9, for example, the electromagnetic-wave suppressing device may be formed such that the electromagnetic-wave suppressing material 1 is sealed with an insulating film.

Figure 10:
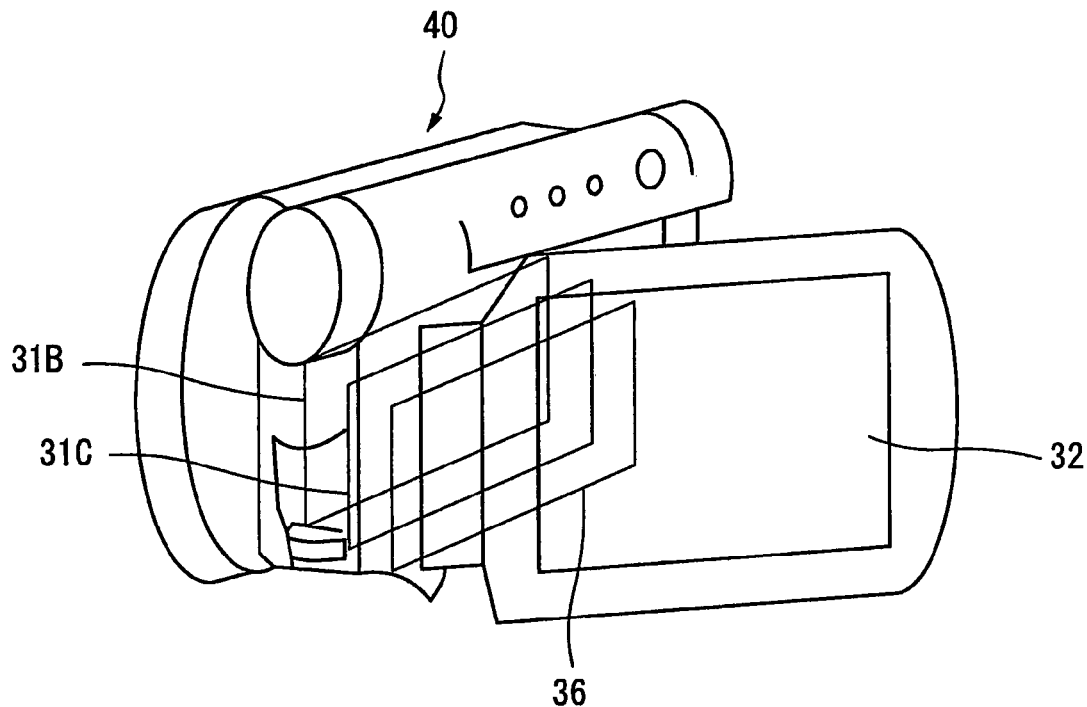
FIG. 10 is a schematic perspective view illustrating a second example of a video camera as an electronic apparatus according to an embodiment of the present invention.

Next, FIG. 10 is a schematic perspective view illustrating a video camera that is a second example of the electronic apparatus according to an embodiment of the present invention.

As shown in FIG. 10, a video camera 40 includes a B-board (printed-wiring board) 31B on which electronic parts are mounted and a C-board (printed-wiring board) 31C on which electronic parts are mounted. The video camera 40 further includes a casing 36 and a monitor screen 32.

Figure 11:
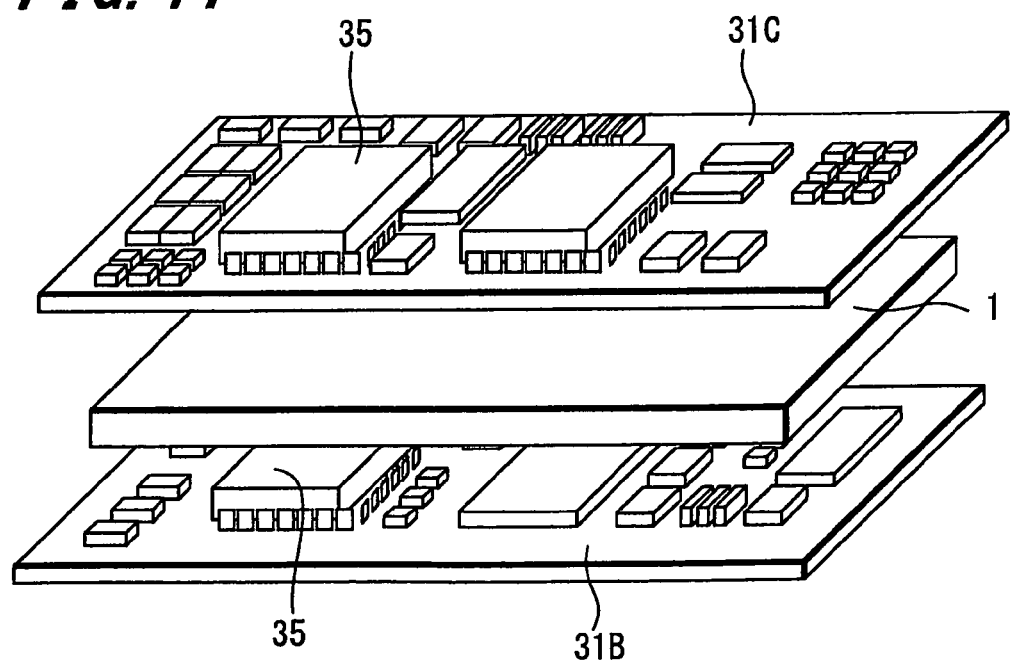
FIG. 11 is a schematic perspective view illustrating main parts of the video camera shown in FIG. 10.

FIG. 11 is a perspective view illustrating main parts of the video camera 40. As shown in FIG. 11, in this video camera 40, the electromagnetic-wave suppressing material 1 according to an embodiment of the invention alone may be arranged to fill the space between the B-board 31B and the C-board 31C when the C-board 31C is arranged in the vicinity of the B-board 31B, where electronic parts such as IC chips 35 are mounted on the respective boards 31B and 31C.

Figure 12A:
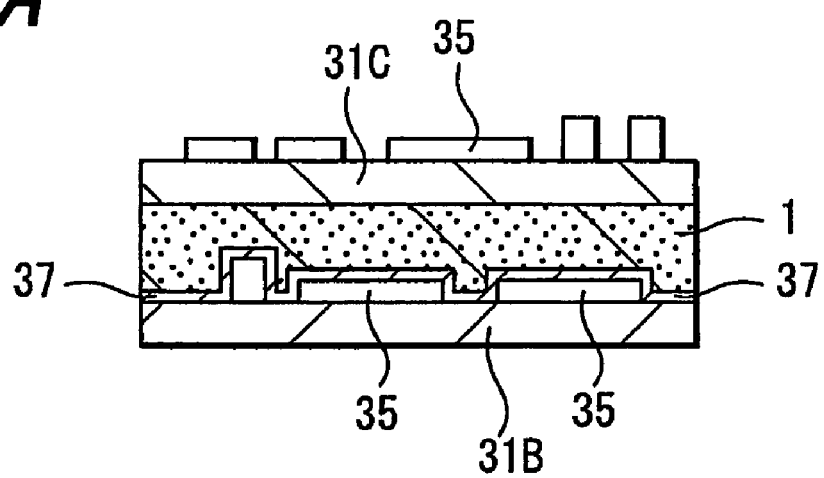
FIGS. 12A and 12B are cross-sectional views illustrating main parts of the video camera shown in FIG. 10, where

In particular, for example, as illustrated in the cross-sectional view of FIG. 12A, the electromagnetic-wave suppressing material 1 can be sandwiched between the mounting side of the B-board 31B and the non-mounting side of the C-board 31C.

Figure 12B:
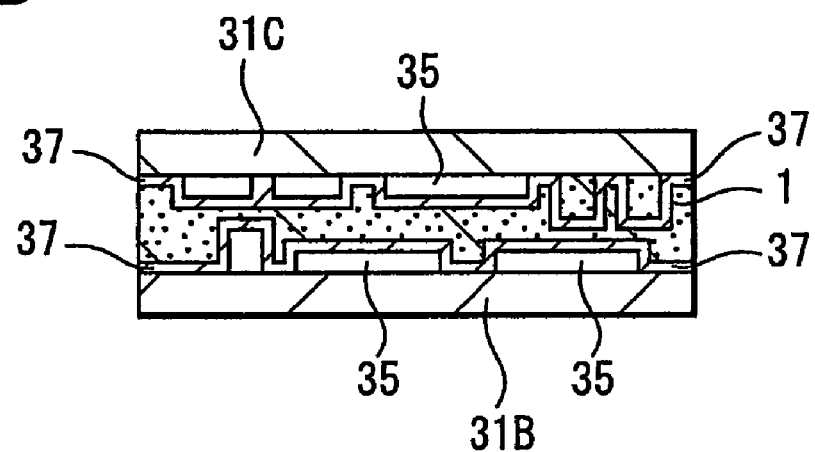

In addition, for example, as illustrated in the cross-sectional view of FIG. 12B, the electromagnetic-wave suppressing material 1 can be sandwiched between the mounting side of the B-board 31B and the mounting side of the C-board 31C.

If there is a risk of short circuit on the surface of such board, the surfaces of the B-board 31B and the C-board 31C may be coated with an insulating laminate film 37 as illustrated in the respective cross-sectional views of FIGS. 12A and 12B. Accordingly, the space between the B-board 31B and the C-board 31C can be filled with the electromagnetic-wave suppressing material 1 alone on the insulating laminate film.

Figure 13:
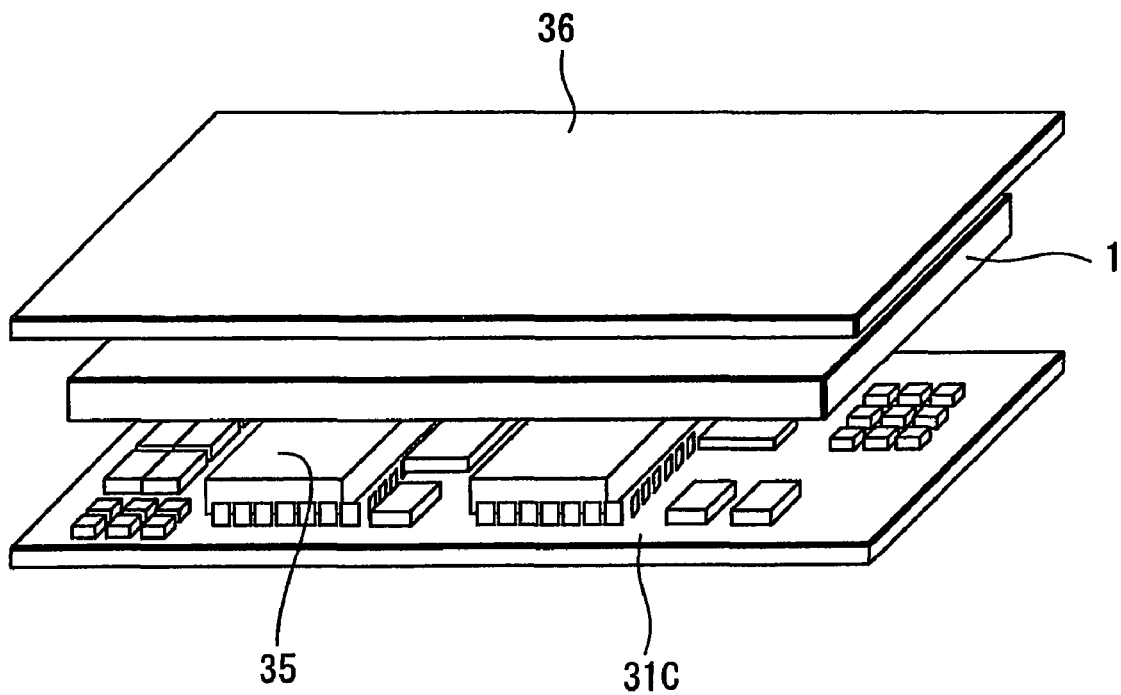
FIG. 13 is a schematic perspective view illustrating a C-board, a casing and the periphery thereof of the main parts of the video camera shown in FIG. 10.
Figure 14:
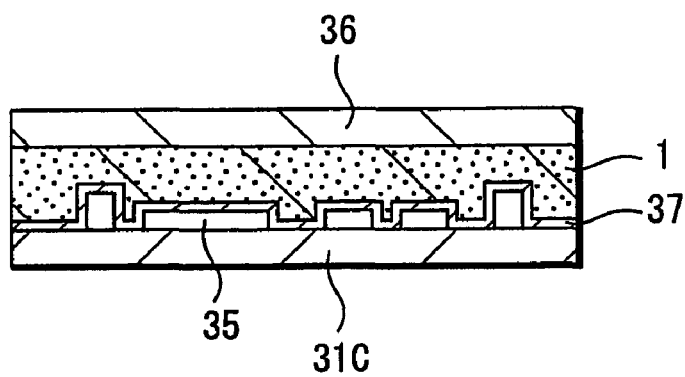
FIG. 14 is a schematic cross-sectional view illustrating a C-board, a casing and the periphery thereof of the main parts of the video camera shown in FIG. 10.

Similarly, when the casing 36 is arranged in the vicinity of the C-board 31C, an insulating laminate film 37 is applied to the surface of the C-board 31C as illustrated in the perspective view of FIG. 13 and the cross-sectional view of FIG. 14 so that the space between the C-board 31C and the casing 36 can be filled with the electromagnetic-wave suppressing material 1 of an embodiment of the invention alone.

In the second example also, instead of forming the electromagnetic-wave suppressing device using the electromagnetic-wave suppressing material 1 alone, the electromagnetic-wave suppressing device may be formed in other ways such that the electromagnetic-wave suppressing material 1 is sealed with an insulating film.

Thus, the electromagnetic-wave suppressing material 1 is provided to at least one of the area of generating inner electromagnetic waves and the area of receiving external electromagnetic waves. Accordingly, the influence of electromagnetic waves to the electronic apparatus or the influence of electromagnetic waves from the electronic apparatus can be suppressed to a minimum.

Accordingly, the electronic apparatus with electromagnetic compatibility and high reliability for stable operation can be obtained.

FIGS. 2A to 2C illustrate only a few examples of the electromagnetic-wave suppressing device according to an embodiment. According to an embodiment of the present invention, the electromagnetic-wave suppressing device may have any other form because the electromagnetic-wave suppressing material is capable of being prepared in any desired form.

Figure 15A:
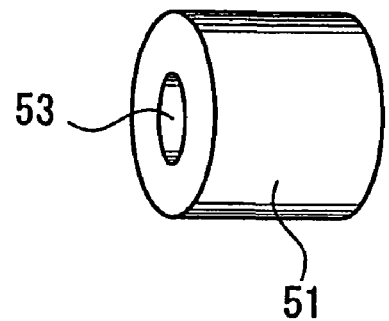
FIGS. 15A to 15C are schematic views illustrating modified examples of an electromagnetic-wave suppressing device according to an embodiment of the present invention, where
Figure 15B:
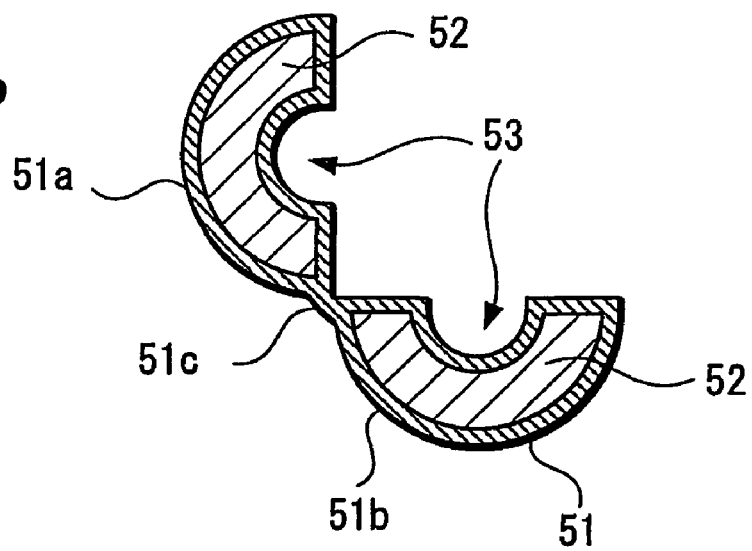
Figure 15C:
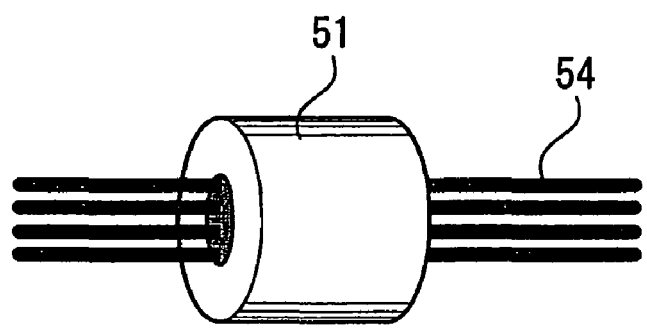

FIGS. 15A to 15C are schematic views illustrating other examples of the configuration of an electromagnetic-wave suppressing device according to an embodiment of the present invention.

FIG. 15A is a perspective view of the electromagnetic-wave suppressing device and FIG. 15B is a cross-sectional view thereof.

As illustrated in FIGS. 15A and 15B, an electromagnetic-wave suppressing device 50 of the example includes a cylindrical resin casing 51, which also serves as a sealing member, sealed with an electromagnetic-wave suppressing material 52.

The resin casing 51 is a hollow casing having a cylindrical shape. The hollow casing is filled and sealed with the electromagnetic-wave suppressing material 52 to have a cylindrical form as a whole.

As shown in FIG. 15B, the resin casing 51, which becomes a cylindrical form when mounted, is divided in two along the center axis passing through a central opening 53. The divided two halves (hereinafter, referred to as divided cores) 51a and 51b of a sealing member can be opened and closed via a flexible connection part 51c. The divided cores 51a and 51b in a closed combined state forms the cylindrical form.

The respective divided cores 51a and 51b have hollow structures to be independently filled and sealed with the electromagnetic-wave suppressing material 52. In addition, the connection part 51c is made of resin with the same quality of materials as that of the divided cores 51a and 51b to connect the outer walls of the divided cores 51a and 51b.

Furthermore, the resin casing 51 formed of the divided cores 51a and 51b is made of resin capable of transmitting electromagnetic waves. In addition, the casing 51 has such hardness as to keep the cores in a certain form. The electromagnetic-wave suppressing device 50 can be prepared by injecting the electromagnetic-wave suppressing material 52 into the resin casing 51.

FIG. 15C is a perspective view illustrating the state of the electromagnetic-wave suppressing device 50 represented in FIGS. 15A and 15B being attached to a harness 54 that is an electric-signal transmitting medium.

When the electromagnetic-wave suppressing device 50 of this example is attached to the harness 54, the divided cores 51a and 51b are opened (the state shown in FIG. 15B) and the harness 54 is then placed in the central opening 53. Subsequently, the divided cores 51a and 51b are closed together to be integrated with the harness 54.

Furthermore, the divided cores 51a and 51b can be engaged or joined together using an engaging device (not shown). For example, according to a method, recessed and protruded portions are formed on the divided cores 51a and 51b to engage them together or a tape is used to join them together. Therefore, the divided cores 51a and 51b can be easily attached to the harness 54 of the electromagnetic-wave suppressing device 50 in a manner of holding the harness 54.

Furthermore, in this example, the electromagnetic-wave suppressing device 50 may be alternatively prepared by making the electromagnetic-wave suppressing material 52 in sheet form in advance and then fitting the electromagnetic-wave suppressing material 52 in the core-shaped resin casing 51. Alternatively, the sealing member may be, for example, one made of PET, film, glass, or the like instead of the resin casing.

The electromagnetic-wave suppressing device 50 of this example is prepared by filling and sealing the hollow cylindrical resin casing 51, which also serves as an sealing member, with the electromagnetic-wave suppressing material 52. Thus, as shown in FIG. 15C, the harness 54 or the like is held by the resin casing 51, so that the electromagnetic-wave suppressing device 50 can suppress electromagnetic wave interference in a high-frequency band.

In addition, the resin casing 51 is formed of two divided core halves 51a and 51b connected using a flexible connection part 51c. Thus, it can be easily attached to an electric signal transmitting medium such as the harness 54.

In the example as illustrated in FIGS. 15A to 15C, the cylindrical electromagnetic-wave suppressing device 50 is used. Alternatively, the device 50 may be a rectangular-shaped device having a rectangular outer shape and a central opening with a circular cross section. Alternatively, furthermore, it may be made in another form if desired.

The present invention is not limited to the above embodiments and may be embodied in several forms without departing from the gist of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. An electromagnetic-wave suppressing device including an electromagnetic-wave suppressing material, the electromagnetic-wave suppressing material comprising:
   an ionic liquid; and
   nanometer-order particles mixed with the ionic liquid, wherein
   10 wt % or more of the nanometer-order particles is mixed with respect to 100 wt % of the ionic liquid.

2. The electromagnetic-wave suppressing device according to claim 1, wherein
   a sealing member is sealed with the electromagnetic-wave suppressing material.

3. The electromagnetic-wave suppressing device according to claim 1, wherein the electromagnetic-wave suppressing material is in sheet form.

4. The electromagnetic-wave suppressing device according to claim 1, wherein
   the electromagnetic-wave suppressing material is in bulk form.

5. The electromagnetic-wave suppressing device according to claim 1, wherein
   an insulating material is laminated on the electromagnetic-wave suppressing material.

6. The electromagnetic-wave suppressing device according to claim 1, wherein the ionic liquid is a mixture of an anionic ion $X^-$ and one of an imidazolium salt of 1-ethyl-3-methyl imidazolium, a pyridinium salt of 3-butyl pyridium and an aliphatic quaternary ammonium salt.

7. The electromagnetic-wave suppressing device according to claim 6, wherein the anionic ion $X^-$ is $(CF_3SO_2)_2N^-$, $BF_4^-$, $PF_6^-$.

8. The electromagnetic-wave suppressing device according to claim 6, wherein the nanometer-order particles is one of a dielectric material with a specific permittivity of 10 or more at 1 kHz at room temperature and a magnetic material with a relative magnetic permeability of 100 or more at 100 MHz at room temperature.

9. An electronic apparatus comprising:
an integrated circuit device;
a wiring line; and
an electromagnetic-wave suppressing device located in the vicinity of at least one of the integrated circuit device and the wiring line, wherein
the electromagnetic-wave suppressing device including an ionic liquid and nanometer-order particles mixed with the ionic liquid, where 10 wt % or more of the nanometer-order particles is mixed with respect to 100 wt % of the ionic liquid.

10. The electronic apparatus according to claim 9, wherein the ionic liquid is a mixture of an anionic ion $X^-$ and one of an imidazolium salt of 1-ethyl-3-methyl imidazolium, a pyridinium salt of 3-butyl pyridium and an aliphatic quaternary ammonium salt.

11. The electronic apparatus according to claim 10, wherein the anionic ion $X^-$ is $(CF_3SO_2)_2N^-, BF_4^-, PF_6^-$.

12. The electronic apparatus according to claim 10, wherein the nanometer-order particles is one of a dielectric material with a specific permittivity of 10 or more at 1 kHz at room temperature and a magnetic material with a relative magnetic permeability of 100 or more at 100 MHz at room temperature.

* * * * *